April 16, 1968 D. LEYPOLD 3,378,774

REMOTELY CONTROLLABLE TRANSMITTER

Filed Aug. 10, 1964 2 Sheets-Sheet 1

April 16, 1968 D. LEYPOLD 3,378,774

REMOTELY CONTROLLABLE TRANSMITTER

Filed Aug. 10, 1964 2 Sheets-Sheet 2

United States Patent Office 3,378,774

Patented Apr. 16, 1968

3,378,774

REMOTELY CONTROLLABLE TRANSMITTER

Dieter Leypold, Munich-Solln, Germany, assignor to Siemens Aktiengesellschaft, a German corporation Filed Aug. 10, 1964, Ser. No. 388,730
Claims priority, application Germany, Aug. 13, 1963, S 86,716
4 Claims. (Cl. 325—184)

ABSTRACT OF THE DISCLOSURE

Electronically remotely controllable transmitter with adjustable oscillator whose frequency is derived in several adjustable frequency decade stages by frequency-analysis and/or frequency-synthesis process from a standard frequency and its harmonics, and in which, making use of a predetermined frequency preparation plan, the frequency variation at the output of the mixing stage of each frequency decade stage does not exceed one-tenth of the converted frequency, and in which for the frequency preparation in the highest frequency decade stage, following mixing of the oscillator frequency with the frequencies prepared in the other frequency decade stages, the differential frequencies obtained are compared in a phase discriminator with harmonics of the standard frequency for the formation of a readjusting voltage for the adjustable oscillator, the circuit utilizing permanently adjusted filters and requiring no mechanically movable parts.

Figure 1:
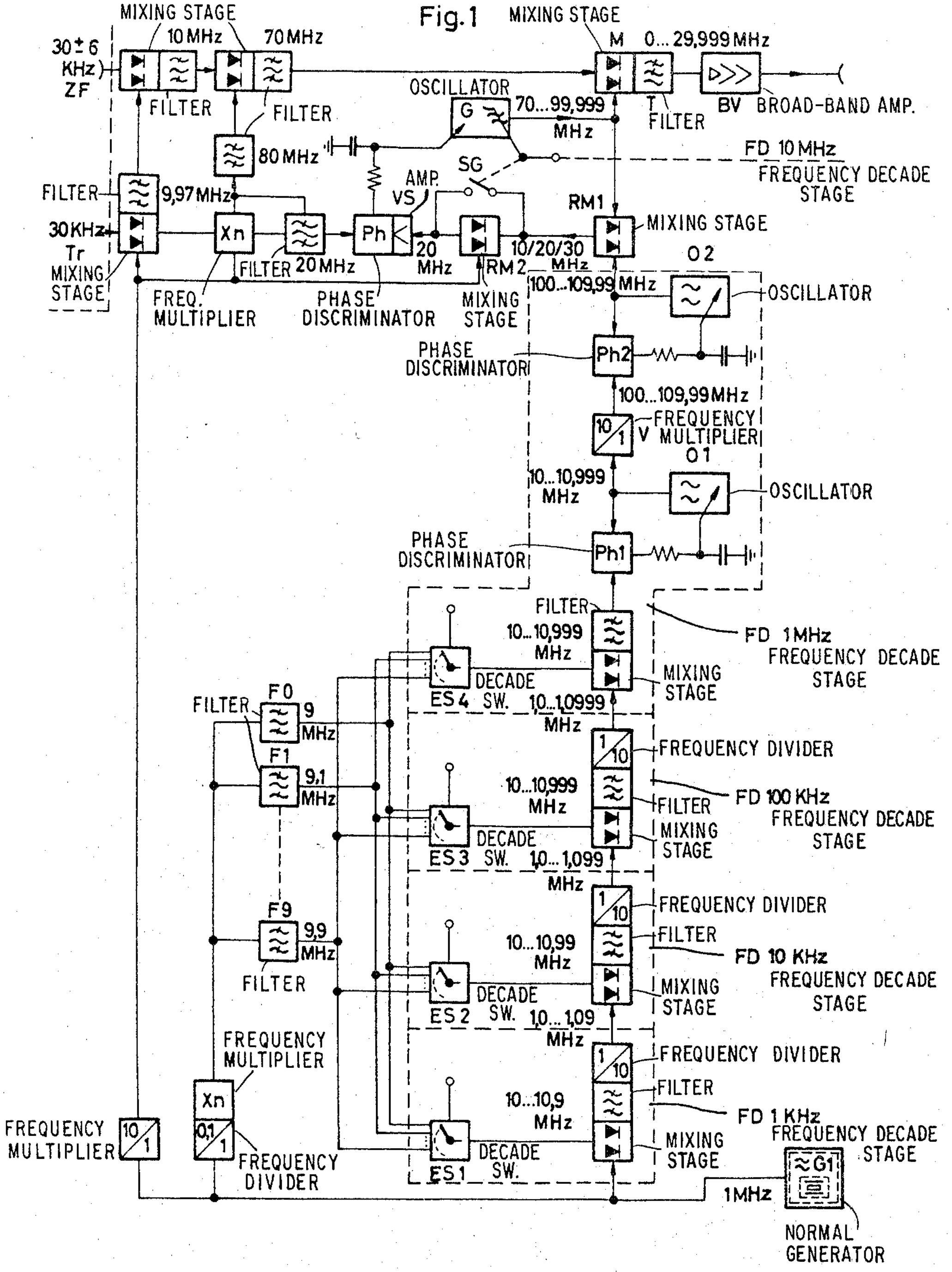

This invention relates to a remotely controllable transmitter and more particularly to the remotely controlled frequency adjustment of the transmitters.

In the remotely controlled frequency adjustment of transmitters, the adjustment should be accomplished with avoidance of mechanically moved tuning devices. The above problem is of predominant importance in the suppression of interfering side waves. The difficulties occurring there increase considerably with the degree of the desired sidewave freedom. The invention is derived from a remotely controllable transmitter of which the transmitting frequency oscillator is adjustable with use of frequency decade stages. The frequency preparation is carried out with a transmitting frequency oscillator adjustable to the frequency-analysis and/or frequency synthesis process, making use of a quartz normal generator and then permanently tuned filters for the formation of a frequency raster of ten harmonics with 100 kHz. frequency spacing, which are offered to each of the frequency decade stages individually at will for the mixing with an input frequency derived from the quartz oscillation or in each case with frequency obtained from the preceding frequency decade stage over a filter and a frequency divider, by remote control, whereupon from a reference frequency prepared in this way and the frequency of the adjustable oscillator there is obtained by phase comparison a readjusting voltage for the adjustable oscillator, in which process in conjunction with the use of a frequency plane for the frequency preparation of each frequency decade stage, in which dependence on the quartz-stabilized input frequency and on the frequency position of the 100 kMz. frequency spectrum for mixing the frequency variation is achieved at the output of the modulator of each frequency decade stage which does not exceed 10% of the converted frequency, into filters permanently tuned to the frequency decade stages and frequency-regulated frequency dividers are used without tuning.

According to the invention, the problem basic to the application is solved and also in the cases in which especially high demands are made on the side-wave-freedom of the output frequency of the transmitter, through the feature that the frequency preparation in the highest frequency decade stage (10 mHz.-decade) is executed in such a way that the frequency of the adjustable oscillator is mixed directly with the frequency prepared in the other frequency decade stage, so that the differential frequency obtained through the mixture is zero or a harmonic (10, 20, 30 mHz.) of the frequency of the quartz normal generator, and that these frequencies obtained at the output of the mixing stage or modulator, if need be after a further conversion and amplification, and after comparison with the corresponding harmonics of the quartz normal generator, are used in a phase bridge for the frequency-fixed readjustment of the adjustable oscillator.

Therefore, in accordance with a further advantageous development of the invention, in dependence on the particular step set of the highest decade stage utilized the frequency obtained at the output of the mixing stage or modulator is fed, either over another modulator or directly, to a phase discriminator, whose output voltage serves for the readjustment of the adjustable oscillator, in which procedure the converter stage for the modulator and the comparative or frequency of the phase discriminator are harmonics of the quartz normal generator.

The converter frequency fed to the modulator, of the other decade stages, is there generated through frequency tenfolding of these oscillations. In this operation, the oscillations before and after the frequency tenfolding are made free of side waves by an oscillator regulated frequency-rigidly according to the frequency analysis process.

The present invention therefore has among its objects the utilization of a remotely controllable transmitter circuit adjustable so that from a prepared reference frequency and to frequency of an adjustable oscillator through phase comparison a regulating voltage is obtained for the adjustable oscillator.

A further object of the invention is an improved remotely controllable transmitter circuit for the suppression of interferring side waves.

A still further object of the invention is an improved remotely controllable transmitter circuit so that the frequency obtained from the output of a mixing stage or modulator in the circuit may be fed either over a second mixing stage or modulator or directly to a phase discriminator in the circuit, whose output voltage serves for the readjustment of an adjustable oscillator so that the converter frequency for a second mixing stage or modulator and the reference frequency of a phase discriminator in the circuit are harmonics of a quartz normal generator in the circuit.

Still another object of the invention is an improved remotely controllable transmitter circuit wherein the converter frequency of other permanently tuned filters in the circuit fed to a first modulator in the circuit is generated by frequency-ten folding of these vibrations, and that before and after the frequency ten folding through an oscillator regulated frequency rigid according to the frequency-analysis process the oscillations are made free of side waves.

Many other objects and advantages of the construction herein shown and described will be obvious to those skilled in the art from the disclosure herein given.

Figure 2:
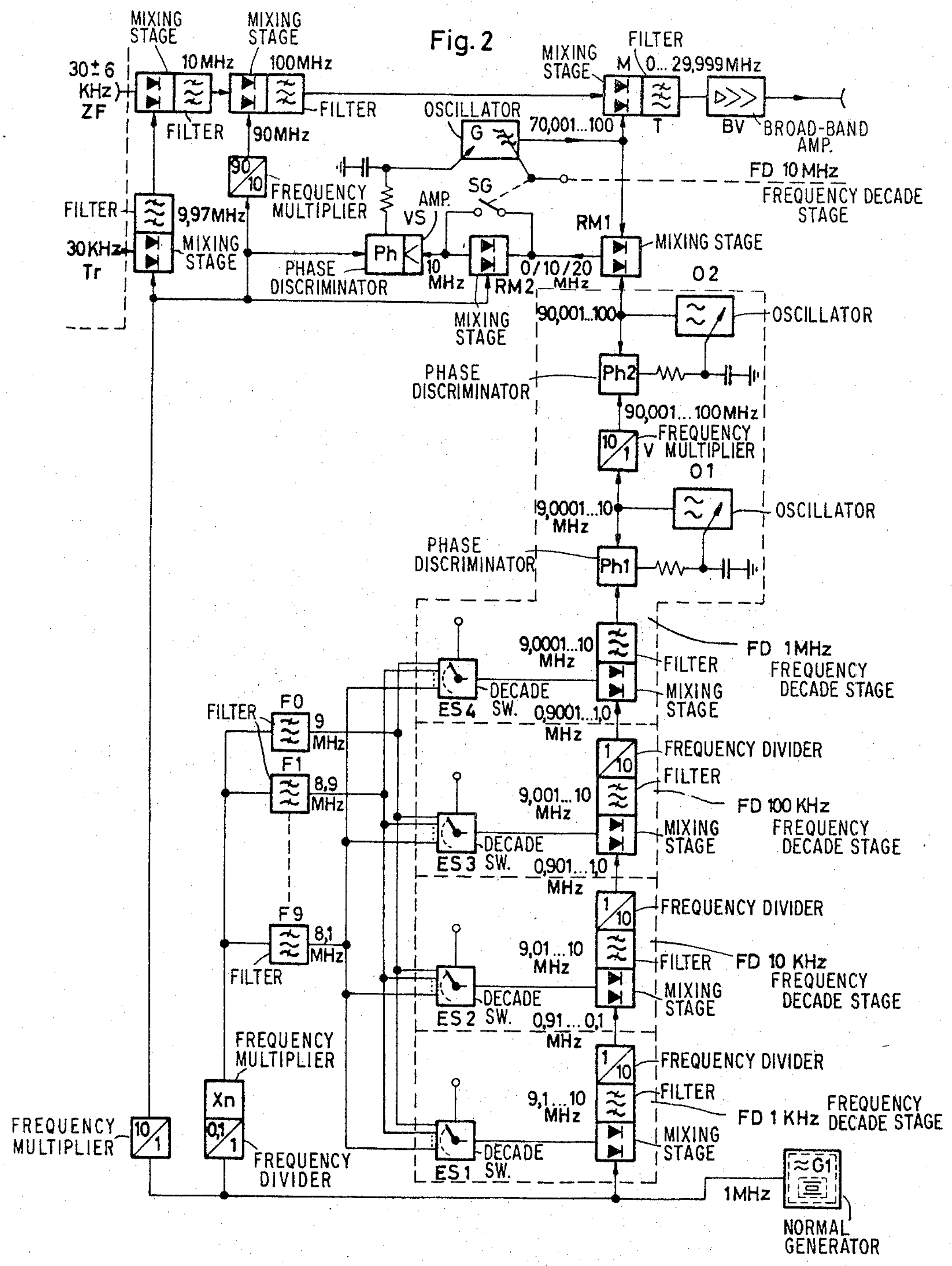

In the drawings, wherein like reference characters indicate like or corresponding parts:

FIGURE 1 is a block circuit diagram for determining the frequency plane III of the 10 kHz. harmonic spectrum of 9 to 9.9 mHz.; and, FIGURE 2 is a block circuit diagram for the harmonic spectrum of 8.1 to 8 mHz. for determing the frequency plane II.

The details of the invention will now be described in detail with the aid of an example, utilizing the frequency planes II and III illustrated in FIG. 2 of the main application.

The embodiments of the invention relate to a short wave transmitter whose sending frequency is adjustable between 0 and 30 mHz. The preparation of the sending or transmitting frequency takes place in the frequency decades FD, of which the smallest frequency decade stage is, for example, 1 kHz. and the highest frequency decade stage is 10 mHz. At the highest frequency decade (10 mHz. decade stage) which is utilized in the present embodiment of this invention, in contrast to the other frequency decades 1 kHz. to 1 mHz., with an incomplete decade stage, which is evaluated only in the first three steps (0, 10, 20, mHz.). Insofar as the frequency preparation is maintained unchanged in the lower frequency decade stages, reference is made to the thorough description of these parts in FIG. 1 in the principal embodiment. So far as possible, therefore, the same reference symbols are used.

In contrast to the principal embodiment, the frequency obtained at the output of the frequency decade stage FD 100 kHz. in FIG. 1 is no longer fed directly into the phase discriminator, but passes, after a frequency division 10:1 for further processing, into the frequency decade stage 1 mHz. Moreover, the harmonics 9 to 9.9 mHz. of the 100 kHz. spectrum pass without a frequency multiplication (tenfolding) over the decade switch ES 4 to the mixing stage of the frequency decade stage 1 mHz. In the band filter of this frequency decade, the frequencies 10 to 10.999 mHz. are sifted out. In this execution of the remotely controlled transmitter there results the advantage that the frequency decade stages FD1 kHz. to FD 1 mHz. except for the locking frequency divider stage in the frequency decade stage 1 mHz. are built up entirely alike. The frequency obtained from the frequency decade stage 1 mHz. between 10 and 10.999 mHz. is tenfolded in a frequency multiplier V. The output frequency of the frequency tenfolder V, which lies between 100 and 109.99 mHz. is compared in a mixing stage or ring modulator RM1 directly with the frequency generated in the adjustable oscillator G, which is to be regulated frequency-rigid. In the synchronized state, there still exist at the output of the ring modulator RM1 only the frequencies 10, 20 or 30 mHz., depending on whether the adjustable oscillator G vibrates in the range 100 to 90 mHz., 90 to 80 mHz. or 80 to 70 mHz. The oscillator G is roughly adjustable for these frequency ranges by remote control. Within these decade steps 0, 10, 20 mHz. of the frequency decade stage 10 mHz., the exact frequency adjustment is assured by the evaluation of the output voltage of the ring modulator RM1 in the following manner: the frequency 10, 20 or 30 mHz. obtained on the ring modulator RM1 is fed in at the transmitter-free input of a second, mixing stage or ring modulator RM2 engaged on the outlet side. The carrier voltage supplied to the modulator RM2 is a 10 mHz. oscillation derived from the quartz normal generator G1. The modulator RM2 must, therefore, be bridged over in the event that there is already fed to the modulator RM1 a frequency of 20 mHz., in order to avoid a conversion of this frequency which can be directly evaluated in the phase discriminator P*h*. The direct current from the phase discriminator P*h* is utilized for the frequency-rigid regulation of the oscillator G. The bridging over of the modulator RM2 in operation with the 20 mHz., output oscillation of modulator RM1 can be accomplished through a rectifier by-pass switch. Since in the synchronized state of the transmitter both the 10, 20 and 30 mHz. oscillations and also the added 10 mHz. oscillation added in the modulator RM2 render the frequency stable and/or cohere frequency-rigidly, so that no low-frequency vibrations can arise.

Through the switching in of a second ring modulator RM2 into the frequency preparation of the 10 mHz. decade stage there results a series of advantages. The conversion of the oscillations 10, 20, 30 mHz. obtained in the modulator RM2 at the modulator output of RM1 makes unnecessary a switching over to several reference frequencies (10, 20, 30 mHz.) for the phase discriminator P*h*; since the phase discriminator in the present case is laid out only for one frequency (20 mHz.), it can be kept correspondingly simple in construction. Through the switch SG, which is preferably a diode with bias voltage and which only bridges over the modulator RM2 for the middle frequency (20 mHz.), there is accomplished the increased spacing of the two other frequencies 10 and 30 mHz. connected over the modulator RM2.

Despite careful filtering technique, however, certain harmonics which arise in the frequency multiplier stages are not suppressible to as great a degree as desired. These harmonics can pass, through conversion with the vibration of the adjustable oscillator G1, into a frequency position which leads to interference frequencies in the output voltage of the transmitter. This drawback can be eliminated very effectively at relatively low expenditure by an arrangement such that before and after the frequency tenfolding in the frequency tenfolder stage V between the frequency decade stages 1 mHz. and 10 mHz., the vibrations are made free of side waves through oscillators O1 and O2, respectively regulated frequency-rigid or frequency stable according to the frequency analysis process. The oscillator O1, which is readjusted from the output of the phase discriminator P*h*1, operates in the frequency range from 10 to 10.999 mHz., while the oscillator O2 is regulated by means of the phase discriminator P*h*2 in the frequency range 100 to 109.99 mHz. Through the first frequency-rigidly regulated oscillator O1 harmonics are suppressed of the 100 kHz. harmonic spectrum which pass over the filters F0 to F9 and the decade switch ES 4 to the frequency decade stage 1 mHz., and over the modulator to come to the output of this frequency decade stage. The second oscillator O2 prevents harmonics of the frequency multiplier V from reaching the modulator RM1.

Through this switching improvement there can be achieved a very high side-wave attenuation. The additional expenditure is there compensated, in part, through the fact that the filters necessary in conjunction with the frequency multiplier can be considerably simplified.

In FIG. 2, another embodiment of the invention is represented, which corresponds to the block circuit diagram according to FIG. 1, but is laid out for frequency plane II (100 kHz. harmonic spectrum 9 to 9.9 mHz.). In the manner of operation of the switching system there results exclusively the difference that the output of the modulator RM1 there can occur the frequencies 0, 10 and 20 mHz. In this case the frequency 10 mHz. is fed, with by-passing of the modulator RM2, into the phase discriminator P*h*. For the phase comparison in the phase discriminator P*h*, a 10 mHz. oscillation is drawn upon. In the circuit, there result thereby only unimportant modifications.

The direct current arising at frequency zero at the output of the ring modulator RM1 could in itself be used directly for the readjustment of the oscillator G. Since, however, this regulating current is too small for the direct regulation, it is fed in at the transmitter-free input of the ring modulator RM2. At the output of this modulator, a 10 mHz. component equal as to amount and phase, which, after amplification in amplifier VS, is fed to the phase discriminator P*h*.

Changes may be made within the scope and spirit of the appended claims which define what is believed to be new and desired to have protected by Letters Patent.

What is claimed is:

1. In a remotely controllable transmitter with an adjustable oscillator, whose oscillator frequency is derived in frequency decade stages by frequency analysis and/or frequency synthesis from a standard frequency, comprising a quartz normal generator, a plurality of permanently tuned filters connected to said quartz normal generator for the generation of a frequency raster of ten harmonics a plurality of remote controlled decade switches in which the harmonics are individually selectively available thereover, first frequency decade stage including a first mixing stage for mixing a selected one of the harmonics with the frequency of the normal generator and a first permanently tuned band filter connected to an output of said first mixing stage and a first frequency-regulated frequency divider stage connected with an output of said first band filter, a plurality of further frequency decade stages each including a further mixing stage for mixing a respective other one of the harmonics with the output frequency of a preceding frequency decade stage and a further permanently tuned band filter connected to an output of a respective one of said further mixing stages and a further frequency-regulated frequency divider stage connected with an output of a respective one of said further band filters and in which the frequency variation at the output of the mixing stage of each frequency decade stage does not exceed one-tenth of the converter frequency, the reference frequency obtained in the last frequency decade stage generating by phase comparison with the frequency of the adjustable oscillator a readjusting voltage for such adjustable oscillator, the combination of a second mixing stage (RM1) in which the frequency of said adjustable oscillator (G) is mixed with the frequencies derived in the first and further decade stages (FD 1 kHz., FD 10 kHz., FD 100 kHz., FD 1 mHz.), a further mixing stage (RM2) in which the differential frequencies obtained at the output of mixing stage (RM1) are mixed with a harmonic of said normal generator (G1), a phase discriminator (P*h*) in which the differential frequencies at the output of said further mixing stage (RM2) are compared with corresponding harmonics of said normal generator (G1), the output of said phase discriminator (P*h*) being operatively connected to said adjustable oscillator (G) for the frequency readjustment thereof.

2. A remotely controllable transmitter according to claim 1, comprising a frequency multiplier (V) connected between a last one of said frequency decades and said second mixing stage, a pair of phase locked oscillator stages each having a phase discriminator (P*h*1, P*h*2) one of which is disposed before and the other after the frequency multiplier stage (V), to provide a converter frequency for the adjacent mixing stage (RM1) free of spurious emissions.

3. A remotely controllable transmitter according to claim 1, wherein said adjustable oscillator has a coarse range adjustment operated in conjunction with a means for by-passing the mixing stage (RM2) at the input side of said phase discriminator (P*h*) in certain frequency ranges of the highest frequency decade (FD 10 mHz.).

4. A remotely controllable transmitter according to claim 3, comprising a frequency multiplier (V) connected between a last one of said frequency decades and said second mixing stage, a pair of phase locked oscillator stages each having a phase discriminator (P*h*1, P*h*2), one of which is disposed before and the other after the frequency multiplier stage (V), to provide a converter frequency for the adjacent mixing stage (RM1) free of spurious emissions.

References Cited

UNITED STATES PATENTS

| | | | |
|---|---|---|---|
| 2,829,255 | 4/1958 | Bolie | 331—40 |
| 2,868,973 | 1/1959 | Jensen et al. | 331—22 |
| 2,964,714 | 12/1960 | Jakubowics | 331—22 X |
| 3,235,815 | 2/1966 | Kiecher | 331—39 |
| 3,278,856 | 10/1966 | Topping | 331—22 X |

ROBERT L. GRIFFIN, *Primary Examiner.*

JOHN W. CALDWELL, *Examiner.*

B. V. SAFOUREK, *Assistant Examiner.*